(12) United States Patent
Kusumoto et al.

(10) Patent No.: US 10,796,890 B2
(45) Date of Patent: Oct. 6, 2020

(54) PLASMA PROCESSING APPARATUS AND SAMPLE STAGE THEREOF

(71) Applicant: HITACHI HIGH-TECHNOLOGIES CORPORATION, Tokyo (JP)

(72) Inventors: Hironori Kusumoto, Kudamatsu (JP); Yutaka Ohmoto, Hikari (JP); Kazunori Nakamoto, Kudamatsu (JP); Koji Nagai, Kudamatsu (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 58 days.

(21) Appl. No.: 16/169,085

(22) Filed: Oct. 24, 2018

(65) Prior Publication Data

US 2019/0057846 A1 Feb. 21, 2019

Related U.S. Application Data

(63) Continuation of application No. 15/016,438, filed on Feb. 5, 2016, now Pat. No. 10,141,165, which is a (Continued)

(30) Foreign Application Priority Data

Feb. 1, 2013 (JP) .................................. 2013-018017

(51) Int. Cl.
*H01J 37/32* (2006.01)
*H01L 21/67* (2006.01)

(52) U.S. Cl.
CPC .. *H01J 37/32724* (2013.01); *H01J 37/32082* (2013.01); *H01J 37/32192* (2013.01);
(Continued)

(58) Field of Classification Search
None
See application file for complete search history.

(56) References Cited

U.S. PATENT DOCUMENTS

| | | |
|---|---|---|
| 6,431,112 B1 | 8/2002 | Sill et al. |
| 2003/0024920 A1 | 2/2003 | Ratliff et al. |

(Continued)

FOREIGN PATENT DOCUMENTS

| | | |
|---|---|---|
| JP | 2001-217195 A | 8/2001 |
| JP | 2002-231421 A | 8/2002 |

(Continued)

OTHER PUBLICATIONS

Office Action, dated Mar. 4, 2016, which issued during the prosecution of Chinese Application No. 201310057014.2, which corresponds to the present application (English translation attached).

*Primary Examiner* — Shamim Ahmed
(74) *Attorney, Agent, or Firm* — Baker Botts L.L.P.

(57) ABSTRACT

There is disclosed a plasma processing apparatus for processing a wafer put on a sample stage disposed in a processing chamber within a vacuum vessel by the use of a plasma generated in the processing chamber after mounting the wafer on the sample stage. The apparatus has heaters in areas of the interior of the sample stage which are divided radially and circumferentially. At least those of the heaters which are arranged in the areas located in the radially outer position include circumferentially arranged heater portions that are connected in series. The amounts of heat generated by these circumferentially arranged heater portions are adjusted.

7 Claims, 3 Drawing Sheets

Related U.S. Application Data continuation of application No. 13/798,270, filed on Mar. 13, 2013, now abandoned.

(52) U.S. Cl.
CPC .. *H01J 37/32522* (2013.01); *H01J 37/32825* (2013.01); *H01L 21/67069* (2013.01); *H01L 21/67103* (2013.01); *H01L 21/67248* (2013.01); *H01J 2237/334* (2013.01)

(56) References Cited

U.S. PATENT DOCUMENTS

| | | | |
|---|---|---|---|
| 2005/0252903 A1 | 11/2005 | Maki et al. | |
| 2008/0110874 A1 | 5/2008 | Hayashi et al. | |
| 2009/0044750 A1 | 2/2009 | Pipitone | |
| 2009/0111276 A1* | 4/2009 | Dhindsa | C23C 16/4557 438/710 |
| 2010/0193130 A1* | 8/2010 | Kawakami | H01L 21/67109 156/345.37 |
| 2011/0297082 A1 | 12/2011 | Watanabe et al. | |
| 2013/0256966 A1* | 10/2013 | Volfovski | H05B 3/26 269/302 |

FOREIGN PATENT DOCUMENTS

| | | |
|---|---|---|
| JP | 2004-241302 A | 8/2004 |
| JP | 2008-115440 A | 5/2008 |

* cited by examiner

PLASMA PROCESSING APPARATUS AND SAMPLE STAGE THEREOF

CROSS-REFERENCE TO RELATED APPLICATIONS

The present application is a continuation of, and claims priority to, U.S. patent application Ser. No. 15/016,438, filed Feb. 5, 2016 and which issued as U.S. Pat. No. 10,141,165, which is a continuation of, and claims priority to, U.S. patent application Ser. No. 13/798,270, filed Mar. 13, 2013, now abandoned, which claims priority to Japanese Patent Application No. 2013-018017, filed Feb. 1, 2013, the contents of each of which are hereby incorporated by reference in their entireties.

BACKGROUND OF THE INVENTION

The present invention relates to a plasma processing apparatus for processing a wafer disposed within a processing chamber inside a vacuum vessel with a plasma generated within the processing chamber and to a sample stage disposed in this plasma processing apparatus. More particularly, the invention relates to a plasma processing apparatus operative to perform processing while adjusting the temperature of a sample stage which is disposed in such a processing chamber and on which a wafer is mounted. The invention also relates to this sample stage.

In the above-described plasma processing apparatus, it has been heretofore considered to process vertically adjacent films (so-called multilayer film) formed on the surface of a sample such as a substrate (e.g., a semiconductor wafer) within the same processing chamber in such a way that the wafer is not taken out of the processing chamber during the processing of each film, in order to etch the multilayer film in a shortened time. This apparatus is required to perform finer processing at higher accuracy. To realize this, it is necessary that the uniformity of the wafer profile obtained as a result of etching of films to be processed be enhanced along its plane (i.e., radially and circumferentially). For this purpose, the temperature of a sample stage having a top surface on which a wafer is mounted and thus the temperature of the wafer have been adjusted to values appropriate for the processing during the processing of the films.

A known technique of adjusting such temperatures is disclosed, for example, in JP-A-2002-231421. That is, the top portion of a sample mounting stage constituting a surface on which a wafer is mounted is made of a disk-like member made of a ceramic. A heater is connected to this sample mounting stage and disposed below this stage. The temperature of the ceramic disk and the temperature of the wafer mounted on top of the disk are made appropriate for processing by adjusting the amount of heat generated by the heater. Especially, JP-A-2002-231421 discloses a ceramic heater consisting of a ceramic substrate in a disk-like form and a resistive heating element formed on or in the substrate. Another resistive heating element consisting of at least two circuits split circumferentially is formed in an outer peripheral portion of the ceramic substrate. A further resistive heating element made of a separate circuit is formed inside the resistive heating element disposed in the outer peripheral portion.

In this conventional technique, the heaters, i.e., the resistive heating elements, are made of a material prepared by mixing an electrically conductive material or semiconductor material into a metal or a heatproof resin. Connectors are placed in through-holes formed in the sample stage, and serve to supply electric power. Heaters are disposed in two different areas of the sample stage which are located around the center and in an outer peripheral portion, respectively. The heaters are connected with power supplies via their respective connectors such that different levels of electric power may be supplied to the heaters.

In the above-described conventional technique, the aforementioned configuration makes it possible to obtain a distribution of temperature values varying from the center of the wafer toward the outside (i.e., in the radial direction of the wafer in a disk-like form) by controlling the temperature of the central portion and the temperature of the outer peripheral portion of the sample stage and of the wafer mounted on top of it to their respective desired values.

SUMMARY OF THE INVENTION

The conventional technique described above causes problems because sufficient consideration is not given to the following points.

That is, in recent years, semiconductor devices have been required to be processed in reduced sizes and at higher accuracy. Fulfillment of these requirements has increased variations in processing results along the surface of each wafer obtained as a result of processing of films due to nonuniformity of temperature in the circumferential direction of the wafer during fabrication steps of semiconductor devices, especially in the outermost portions of the wafer. Especially, as wafers increase further in diameter, the lengths of the outer peripheries of the wafers increase. If a wafer protrudes beyond the outer fringes of the wafer mounting surface of the sample stage while the wafer is mounted on the mounting surface of the sample stage, parts of the wafer are not in contact with the sample stage. The edge zones of the wafer are not sufficiently temperature-controlled through the sample stage. If the edge zones are processed at relatively higher temperatures, there is the problem that temperature nonuniformity in the outer portion in the circumferential direction increases either due to nonuniform transfer of heat (cooling) in the circumferential direction of the wafer or due to variations in the amount of heat entering from the plasma.

In view of this problem, it is conceivable to correct variations in the amount of entered or transferred heat and variation of the temperature across the wafer by placing the aforementioned heaters in areas divided in the circumferential direction and controlling the amounts of current supplied to the circumferentially arranged heaters in the same way as where the amounts of heat generated by the heaters disposed in the radially arranged areas are controlled in the above-described conventional technique. However, in this configuration, in a case where a bias potential is applied to a sample stage using RF electric power when a wafer is processed by the use of a plasma generated in a processing chamber, an increase in the electrostatic capacity in the power feeding line will increase the amount of leakage of the RF electric power. This makes the etch rate of the wafer uneven or the film structure becoming semiconductor devices is damaged electrostatically. As a result, the yield will deteriorate. These problems have not been taken into account in the above-described conventional technique.

It is an object of the present invention to provide a plasma processing apparatus and sample stage for reducing temperature variations in the circumferential direction of a wafer to be processed to thereby permit the wafer to be processed at higher accuracy.

The above-described object is achieved by a plasma processing apparatus for processing a wafer mounted on a sample stage within a processing chamber inside a vacuum vessel with a plasma generated in the processing chamber. The plasma processing apparatus has: a plurality of heaters disposed respectively in a plurality of areas obtained by dividing a cylindrical interior of the sample stage radially (in a direction going outwardly from the center of the cylindrical interior) and circumferentially about the center of the cylindrical interior; and a control unit for adjusting amounts of heat generated by the heaters. The heaters include heaters which are disposed in the areas arranged circumferentially at the same radius about the center. These circumferentially disposed heaters are connected in series with DC power supplies and form a circuit, and amounts of heat generated by these heaters are adjusted by the control unit.

Other objects, features and advantages of the invention will become apparent from the following description of the embodiments of the invention taken in conjunction with the accompanying drawings.

DETAILED DESCRIPTION OF THE EMBODIMENT

The preferred embodiment of the present invention is hereinafter described with reference to the drawings.

Embodiment

Figure 1:
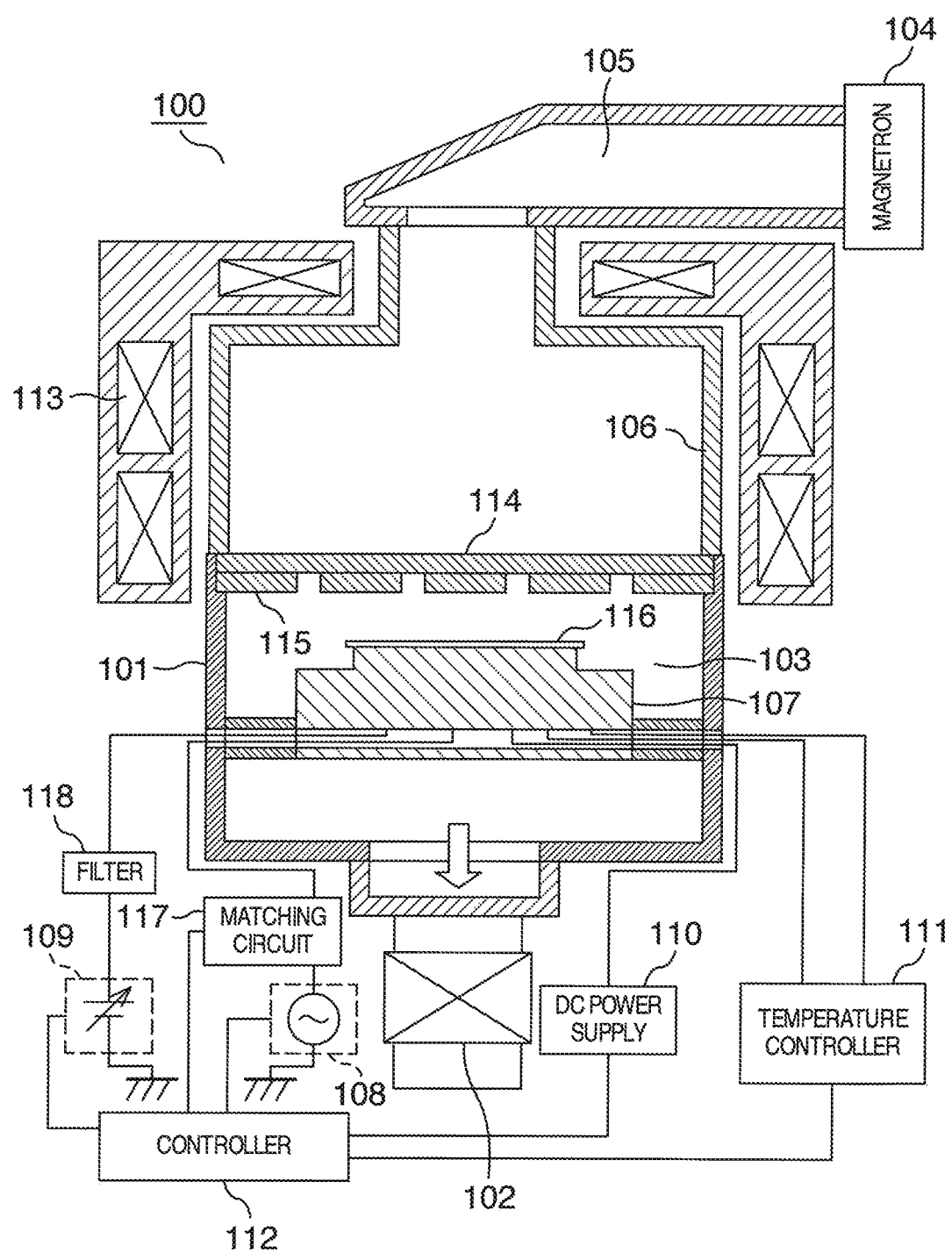
FIG. 1 is a vertical cross section of a plasma processing apparatus associated with one embodiment of the present invention, schematically showing the structure of the apparatus.

One embodiment of the present invention is hereinafter described by referring to FIGS. 1-3. FIG. 1 is a vertical cross section of a plasma processing apparatus associated with this embodiment, schematically showing the structure of the apparatus. This apparatus is etching equipment for generating a plasma using electron cyclotron resonance (ECR) that makes use of microwaves.

The plasma processing apparatus, generally indicated by reference numeral 100, is composed of two major parts: a plasma generating section and an evacuation section. The plasma generating section has a vacuum vessel 101 and electric/magnetic field application means located above the vacuum vessel 101. The vacuum vessel 101 includes a cylindrical processing chamber 103 therein, the chamber being used for plasma processing. The evacuation section is disposed under the vacuum vessel 101 and has a vacuum pump for exhausting gases and particles from inside the processing chamber 103. The evacuation section adjusts the interior of the processing chamber 103 to a desired degree of vacuum. Furthermore, the plasma processing apparatus 100 has a control unit including a controller 112 for receiving signals indicating the results of detections of the operations of the components of the plasma processing apparatus 100 and issuing instruction signals for controlling the operations.

The vacuum vessel 101 has a top portion provided with a circular opening that is covered with a dielectric window 114 in a disk-like form. For example, the window 114 is made of quartz. A seal member is squeezed between the upper end of the vacuum vessel 101 forming the opening and the outer fringes of the dielectric window 114, thus providing a hermetic seal between the interior of the processing chamber 103 and the outside atmospheric ambient. A circular shower plate 115 made of a dielectric substance such as quartz is disposed in the processing chamber and below the dielectric window 114. The shower plate 115 is provided with a plurality of through-holes through which an etchant gas used for plasma processing circulates.

A gas supply passage is formed in the space between the shower plate 115 and the dielectric window 114. Gas supply equipment (not shown) including a gas source and a gas flow controller for controlling the gas flow rate from the source is connected to the gas supply passage. The bottom surface of the shower plate 115 constitutes the top surface of the processing chamber. A sample stage 107 in a cylindrical or disk-like form is disposed in the cylindrical processing chamber 103 such that the vertically extending axis of the sample stage 107 is coincident with the vertically extending axis of the processing chamber 103. The bottom surface of the shower plate 115 is disposed opposite to the circular top surface of the sample stage 107.

The evacuation section is disposed below the vacuum vessel 101 and coupled to the bottom surface of the vacuum vessel 101. A vacuum pumping apparatus 102 such as a turbomolecular pump constituting the evacuation section is in communication with the interior of the processing chamber 103 via a vacuum exhaust port being an opening located at a lower position in the processing chamber 103, which in turn is below the sample stage 107. Flaps (not shown), each in the form of a flat plate, are mounted between the vacuum pumping apparatus 102 and the vacuum exhaust port and rotate about an axis intersecting the vacuum exhaust port. The degree to which the vacuum exhaust port is open is varied (e.g., the area of the opening is varied) according to the angular position of the flaps when they rotate. As a result, the flow rate of gas and particles flowing out from inside the processing chamber 103 through the exhaust port varies. In the present embodiment, the degree of opening and the flow rate of processing gas from the through-holes in the shower plate 115 are controlled according to instruction signals given from the controller 112. The pressure inside the processing chamber 103 is adjusted within a desired range by achieving a balance between the degree of opening and the flow rate.

A plasma generation section disposed above the vacuum vessel 101 has a waveguide tube 105 of circular or rectangular cross section. The waveguide tube 105 is located over, and connected to, the dielectric window 114. The waveguide tube 105 has one end (i.e., low end) having an opening that opens into the underlying processing chamber 103 or into the dielectric window 114. A magnetron 104 generating an electric field of microwaves is disposed at the other end (i.e., upper end). Although no restriction is imposed on the frequency of the microwaves, 2.45 GHz is used in the present embodiment.

The waveguide tube 105 has a portion of rectangular cross section. This portion is a tubular portion whose axis extends in the left-and-right direction (horizontal direction) as viewed in the plane of the figure. The electric field of microwaves generated by the magnetron 104 at one end propagates in the horizontal direction axially toward the other end. At the other end, the portion of rectangular cross section whose central axis extends in the up-and-down direction is coupled to a cylindrical portion of circular cross section. Then, the electric field of microwaves propagates through the cylindrical portion toward the underlying dielectric window 114 or toward the interior of the processing chamber 103.

A magnetic field generating coil 113 is disposed in an outer peripheral portion of the vacuum vessel 101 and above the processing chamber 103 and laterally around the sidewalls of the chamber to supply a magnetic field into the processing chamber 103. The intensity of the magnetic field set up by the magnetic field generating coil 113 is so adjusted that a plasma can be efficiently generated in the processing chamber 103 in conformity with the electric field of 2.45 GHz generated from the magnetron 104.

The lower end of the cylindrical portion of the waveguide tube 105 is coupled to the top of a cylindrical enlarged waveguide tube portion 106 whose main portion is made equal in diameter with the processing chamber 103. The electric field propagates through the cylindrical portion into the enlarged waveguide tube portion 106. Then, the field resonates in a given electric field mode inside the waveguide tube portion 106, passes through the dielectric window 114 and the shower plate 115, and enters a space formed for generation of a plasma, the space being formed between the shower plate 115 and the mounting surface on the top surface of the sample stage 107 inside the processing chamber 103.

The electric field of microwaves introduced into the processing chamber 103 interacts with the magnetic field generated by the magnetic field generating coil 113 to thereby excite the etchant gas supplied into the processing chamber 103 via the shower plate 115. Thus, a plasma is generated in the processing chamber 103. The sample stage 107 is located below, and spaced apart from, the shower plate 115 in the processing chamber 103 to permit formation of the processing chamber 103. A coating (not shown) made of a dielectric material by thermal spraying forms the top surface of the sample stage 107 and is located at the top of a basic material of the sample stage 107. The coating forms the circular mounting surface for a wafer 116 that is a substrate to be processed.

A bias power supply 108 is electrically connected with the metallic basic material of the sample stage 107 to apply RF electric power to the basic material via a matching circuit 117 such that a bias potential is created above the wafer 116. In the present embodiment, the RF bias power supplied from the bias power supply 108 has a frequency in the range from approximately from hundreds of Hz to 50 MHz, more preferably from 400 Hz to 40 MHz. The bias power supply 108 is electrically grounded.

The basic material to which a voltage is applied from the bias power supply 108 is an electrode disposed inside the sample stage 107, and has a disk-like or cylindrical form. The bottom surface of the electrode and the bias power supply 108 are electrically connected. The matching circuit 117 is disposed outside the vacuum vessel 101 for the sample stage 107 in the power feeding path through which electric power is supplied. As described later, the bias power supply 108 and the matching circuit 117 are communicatively connected via both controller 112 and a communication means and receive instruction signals from the controller 112. The operation of the bias power supply 108 and matching circuit 117 is adjusted according to the instruction signals and sends signals indicative of the results of detection of the state of the operation to the controller 112.

Filmy electrodes (not shown) for attracting static electricity are made of a metallic conductive material such as tungsten and disposed in the aforementioned dielectric coating. A static electricity-attracting DC power supply 110 is electrically connected with the electrodes for attracting static electricity via an RF filter circuit (not shown). When the wafer 116 is mounted on the coating, electric power from this power supply is supplied to the electrodes to induce electric polarization in the coating and in the wafer 116, thus producing electrostatic force. This attracts the wafer 116 onto the top surface of the coating, whereby the wafer is held on the sample stage 107.

Filmy heater electrodes are disposed below the static electricity attracting electrodes inside the coating, and are connected with their respective heater electrode DC power supplies 109. That is, there are the same number of heater electrode DC power supplies as the static electricity attracting electrodes in the sample stage 107.

A filter 118 is disposed in the power feeding paths between the heater electrodes and the heater electrode DC power supplies 109 to suppress adverse effects such as deviations from desired amounts of heat caused by the RF power to the heater electrodes from the bias power supply 108, the power supplies 109 operating to supply DC power to the heater electrodes. In the present embodiment, the filter 118 is disposed outside either the vacuum vessel 101 or the processing chamber 103 to enhance the impedance relative to the RF power.

A heat exchange medium whose temperature is controlled within a desired range by a temperature controller 111 (described in detail later) is circulated through a medium passage (not shown) that is arranged to spiral around the center of the basic material in a disk-like or cylindrical form or describe multiple concentric arcs inside the metallic basic material and below the coating. In the present embodiment, fundamentally, the basic material is cooled and so the heat exchange medium is a refrigerant. The medium passage is connected with a refrigerant tube at the bottom surface of the basic material. The entrance and exit of the refrigerant passage are connected with the temperature controller 111.

In the plasma processing apparatus 100 of this construction, the wafer 116 to be processed is carried on a transport means such as a robot arm and transported from a transport container into the processing chamber 103 through a gate (not shown) that is an opening disposed on the sidewall of the vacuum vessel 101. The interior of the transport container has been pumped down to a degree of vacuum comparable to the degree of vacuum inside the processing chamber 103 that is coupled to the sidewall of the vacuum vessel 101. The wafer is then handed over onto the sample stage 107 and mounted on the coating. The opening of the gate is opened and hermetically closed by a gate valve that is disposed inside the transport container and moves up and down.

When the wafer 116 is handed over to the sample stage 107, the robot arm is retracted from the processing chamber 103 into the transport container and the gate is hermetically closed by the gate valve. Then, electric power is supplied to the static electricity attracting electrodes within the coating. The wafer 116 is electrostatically attracted and held over the coating. A process gas is admitted into the processing chamber 103. The pressure inside it is adjusted to a given value appropriate for the processing. Electric and magnetic fields are supplied into the processing chamber. As a result, the process gas is excited. This results in a plasma.

RF electric power is supplied either to the electrodes in the basic material of the sample stage 107 or to the basic material from the bias power supply 108. As a result, a bias potential having a desired potential difference with the plasma is created above the wafer 116. This initiates processing of the film structure on the wafer 116 with the plasma. In the present embodiment, etching is initiated. Especially, charged particles within the plasma are attracted to the surface of the wafer 116 according to the potential difference between the bias potential and the plasma potential and collide against the wafer surface. This promotes anisotropic processing of the film of the film structure on the wafer 116 to be processed.

When the control unit including the controller 112 detects that the desired processing is complete from the processing time, light emission of the plasma, and the result of a detection of the potential either on the wafer 116 or on the sample stage, the supply of the RF power for bias from the bias power supply 108 is terminated. The plasma is extinguished. Thus, the processing ends. The supply of electric power from the DC power supplies 109 for electrostatically attracting the wafer 116 is ceased. Alternatively, the electrodes for electrostatic attraction are reversed in polarity to neutralize the electric charge. Then, the wafer 116 is raised above the sample stage 107 by a raising means such as a pusher pin (not shown).

The gate valve is opened, and the robot arm is stretched through the gate. The arm enters the processing chamber 103. The arm picks up the wafer 116 at its holding portion such as a hand at its front end. Then, the arm is retracted and conveys the wafer 116 out of the processing chamber 103. Thereafter, the robot arm might convey another unprocessed wafer 116 into the processing chamber 103 while the gate is kept open. If the control unit determines that the processing of the wafer 116 in the processing chamber 103 is complete, the control unit gives instructions to the gate valve to maintain the gate hermetically closed until another wafer 116 is conveyed in.

Figure 2:
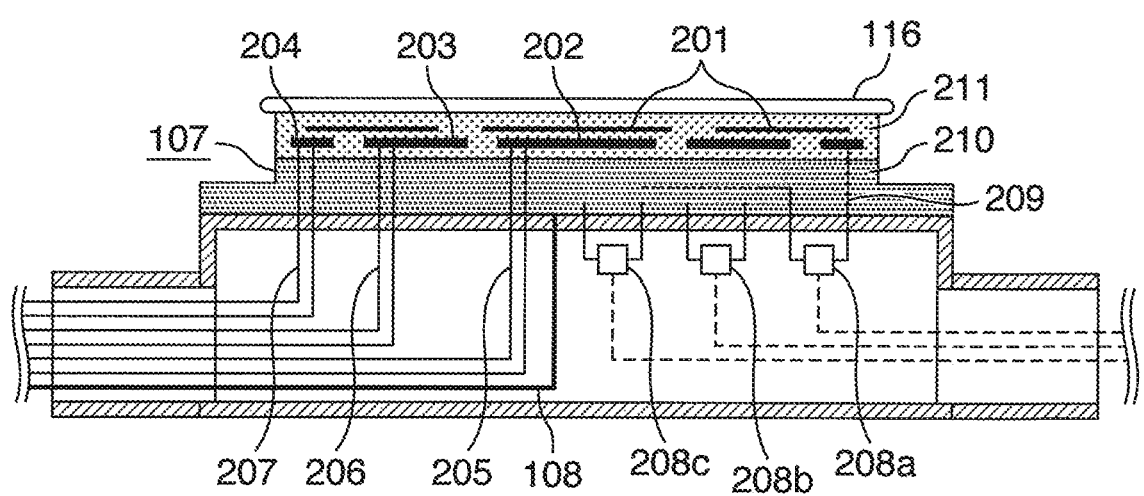
FIG. 2 is an enlarged vertical cross section of the sample stage shown in FIG. 1, showing the structure of the stage.
Figure 3:
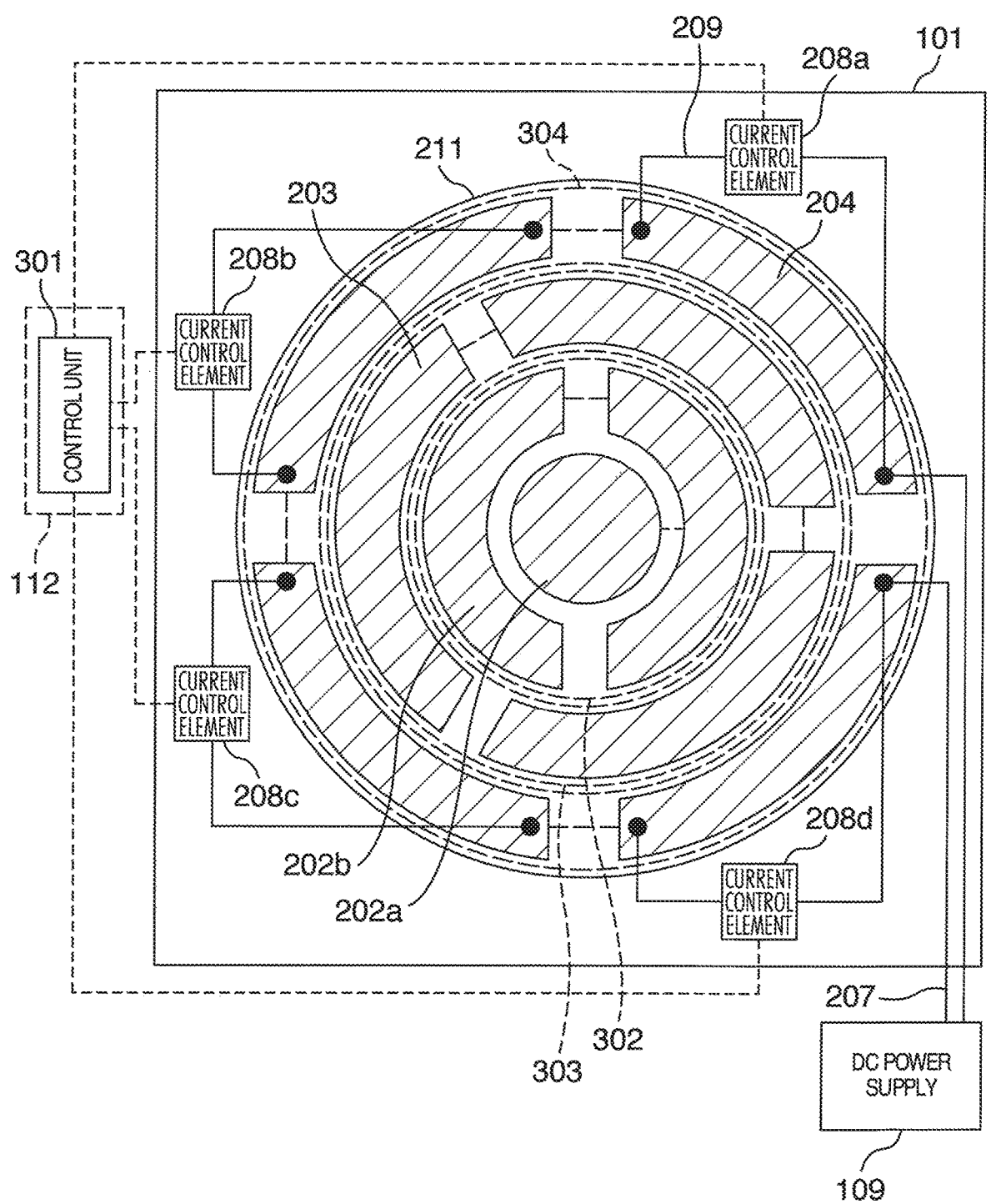
FIG. 3 is an enlarged horizontal cross section of the sample stage shown in FIG. 1, showing the structure of the stage.

The structure of the sample stage 107 is shown in further detail in FIGS. 2 and 3. FIG. 2 is an enlarged vertical cross section of the sample stage shown in FIG. 1, showing the structure of the sample stage. FIG. 3 is an enlarged horizontal cross section of the sample stage shown in FIG. 1, showing the structure of the stage. Especially, FIG. 3 schematically shows a horizontal cross section of the coating on the top surface of the basic material of the sample stage 107, the cross section being taken at the heightwise position of the internal heater electrodes.

In the present embodiment, a dielectric film 211 made of a dielectric substance covers the top surface of the basic material 210 of the sample stage 107 that is electrically connected with the bias power supply 108. Plural electrodes 201 for electrostatic attraction are disposed below the top surface of the dielectric film 211 on which the wafer 116 is put and held by attracting force. An inner heater 202, an intermediate heater 203, and an outer heater 204 for temperature adjustment are disposed below the electrostatic attraction electrodes 201 inside the dielectric film 211.

The inner heater 202, intermediate heater 203, and outer heater 204 are arranged in a circular central area, an intermediate area, and an outer annular area, respectively, of the dielectric film 211 having a circular or a substantially circular top surface conforming with the circular or nearly circular shape of the wafer 116 as described later. The inner heater 202, intermediate heater 203, and outer heater 204 are electrically connected with their respective DC power supplies 109 such that electric power is supplied to the heaters. Power feeding inner heater cable 205, intermediate heater cable 206, and outer heater cable 207 are electrically connected with those heaters and are drawn downward from the bottom surface of the metal basic material 210 in a disk-like form.

Furthermore, in the present embodiment, the outer heater 204 arranged in the outer peripheral area includes arcuate resistors arranged in arcuate subareas which are located at the same radial position, form the same circumferential angle, and have the same length around the center of the circular mounting surface for the wafer 116. The adjacent ones of the resistors are connected in series by connection portions of low-resistance conductors as indicated by the broken line in FIG. 3. The length of the connection portions and the circumferential angle are much smaller than those of the arcuate subareas. Therefore, the outer heater 204 can be substantially regarded as consisting of the arcuate resistors.

As many current control elements 208 (such as 208a, 208b, 208c) as the arcuate resistors are electrically connected with the opposite ends of the respective arcs of the arcuate resistors by a current control element cable 209 in a manner not illustrated in FIG. 2. That is, the current control elements 208 are connected in parallel with the respective arcuate resistors, thus forming electrical circuitry. Three current control elements 208a, 208b, and 208c are shown in FIG. 2. In the present embodiment, four arcs in the outer peripheral portions are angularly spaced about 90 degrees from each other. In practice, there is another current control element 208d as shown in FIG. 3.

As shown in FIG. 3, the mounting surface constituting the top surface of the sample stage 107 of the present embodiment has a circular central portion 302 including the center of the circular mounting surface, an annular intermediate portion 303 located around and outside the central portion, and an outer peripheral portion 304 as viewed from above. The inner heater 202, intermediate heater 203, and outer heater 204 which are arranged annularly are disposed in the inner portions of the dielectric film 211 corresponding to the central portion 302, intermediate portion 303, and outer peripheral portion, respectively.

The filmy resistors arranged in the inner heater 202, intermediate heater 203, and outer heater 204 which are arranged inside the dielectric film 211 are made of the arcuate resistors that are located at the same radial positions, form the same angle, and have the same length. Furthermore, more arcuate resistors are arranged in the inner heater 202, intermediate heater 203, and outer heater 204 on the outer side rather than on the inner side. That is, the arcuate resistors of the heater located closer to the center form greater circumferential angle than those of the heater located more outwardly.

Given values of electric power instructed by the control unit are supplied to the inner heater 202, intermediate heater 203, and outer heater 204 from heater electrode DC power supplies 109 which are electrically connected with the heaters. In the present embodiment, the inner heater 202 has a central heater element 202a being a circular resistor around the center of the mounting surface of the sample stage 107 and outer peripheral heater elements 202b each of which is an arcuate resistor. The outer peripheral heater elements 202b surround the central heater element 202a, assume the same radial position relative to the center of the mounting surface, form the same circumferential angle, and have the same length. Electric power is supplied from the same heater electrode DC power supplies 109 to the central heater element 202a and outer peripheral heater elements 202b of the inner heater 202.

In the present embodiment, each of the inner heater 202, intermediate heater 203, and outer heater 204 has a connector electrically connected with any one of the resistors forming the heaters. The connector acts as a power feeding port. Also, each of these heaters has another connector as a power transmission port, the connector being connected with a resistor different from the power feeding port. The arcuate resistors of the present embodiment are shown as filmy heaters each forming a single arc. Alternatively, the resistors may be bent back in the circumferential direction from the power feeding port to the power transmission port so as to assume plural different radial positions and to cover the areas of the central, intermediate, and outer portions.

Further current control elements 208 are connected in parallel with the resistors of the inner heater 202 and intermediate heater 203. This forms an electric circuit with the heater electrode DC power supplies 109 electrically connected with the respective heaters. The amounts of current through the current control elements 208 are controlled by operation of a control unit 301 including an arithmetic unit constituting the controller 112, storage units, and I/O devices. The control unit 301 of the present embodiment is disposed outside the vacuum vessel 101.

In this way, in the present embodiment, the amounts of currents respectively supplied to the resistors in the central, intermediate, and outer portions are adjusted within appropriate ranges of values by operation of the current control elements 208 connected in parallel with the respective resistors. Consequently, the amounts of heat generated by the arcuate resistors are adjusted within desired ranges. This makes it possible to appropriately adjust variations in the temperature of the wafer mounting top surface of the dielectric film 211 along the circumferential direction around the center of the mounting surface.

The current control elements 208 may be filmy resistors that adjust the amounts of current flowing through the arcuate resistors connected in parallel with their respective control elements 208. The control elements may operate to adjust the resistance value or impedance of the path or to controllably cut off or turn on/off the currents. The control elements may be connected in parallel or may be replaced by appropriate combinations of devices. In the present embodiment, all of the four current control elements 208a, 208b, 208c, and 208d are devices each being configured including a diode. Elements or devices constituting parallel circuits corresponding to the four arcuate resistors need not be made of the same device. Any appropriate selection may be made according to the required specifications.

By adjusting the amounts of heat generated based on the outputs from temperature sensors disposed between the top surface of the basic material 210 inside the basic material 210 located below the central, intermediate, and outside areas and the refrigerant passage, the temperatures of the central, intermediate, and outside areas are adjusted independently along the radial direction going from the center toward the outer periphery. A temperature distribution along the peripheral direction in which the temperature is different among different arcs can be accomplished. As a consequence, the yield can be improved while reducing variations in the temperature along the peripheral direction of the mounted wafer 116 and variations in the results of processing.

As described previously, during the etching process of the present embodiment, the temperatures of the central, intermediate, and outside areas of the wafer supporting surface are adjusted to their desired values for each arcuate area by the use of the inner heater 202, intermediate heater 203, and outer heater 204. In the present embodiment, a refrigerant whose temperature has been set to a given temperature by the temperature controller 111 prior to processing is supplied into the refrigerant passage laid out in the basic material 210. At the beginning of the processing, the temperature of the basic material 210 is set while taking account of heat generated during the processing.

Under this condition, the wafer 116 is mounted on the mounting surface of the sample stage 107. Electric power is supplied from the DC power supply 110 for electrostatic attraction to attract and hold the wafer 116 on the sample stage 107. At this time, a heat transfer gas such as He is supplied from heat transfer gas supply equipment (not shown) to the space between the wafer and the sample stage through the interior of the sample stage. This promotes transfer of heat between the sample stage and the wafer.

Temperature control provided by the outer heater 204 is described below. In the present embodiment, there are similar temperature control means for the inner heater 202 and intermediate heater 203. The outer heater 204 is so arranged that each of the four arcs occupies a substantially 90-degree angular range along the circumferential direction. A connector for bypassing electrical current is disposed in a cable that is connected with one end and the other end of each arcuate resistor constituting the heater pattern. The current control elements 208 are disposed between the connectors of the arcuate resistors and electrically connected with them.

The electrical current supplied to each one connector is split into plural currents and flows into the arcuate resistor and current control element 208 connected in parallel. The outer heater 204 is divided into plural arcs corresponding to the plural arcuate resistors. The values of the currents flowing through the arcuate resistors in the respective areas are adjusted according to the operations of the current control elements 208. That is, the amount of current flowing through the arcuate resistor connected in parallel with any one current control element 208 is controllably varied by controllably varying the amount of current flowing through the current control element 208. The operation of these current control elements 208 is adjusted by calculating the resistance or impedance value of the current control element 208 by means of the arithmetic unit of the control unit 301 and issuing an instruction for operation to each current control element 208 from the I/O device such that the calculated value is reached.

In the present embodiment, electric powers supplied to the heaters are set by the control unit 301 using values detected by the control unit 301 based on the outputs from temperature sensors (not shown) disposed inside the basic material 210 of the sample stage 107 that are located immediately under, and correspond to, the heater areas of the dielectric film 211 within a projection plane as viewed from above. At this time, the heater electrode DC power supplies 109 connected with the outer heaters 204 are controlled to provide constant electric powers.

The current control elements 208a, 208b, 208c, and 208d are on bypass lines which are so disposed as to be connected in parallel with their respective arcuate resistors of the outer heater 204. Instruction signals for operation corresponding to bypass ratios indicating how much percent of current should be bypassed are set by calculating each set of recipe conditions by the control unit 301 prior to processing and are sent to the current control elements 208a-208d. For example, an instruction is given such that a 40% bypass current flows through the current control element 208a, a 30% bypass current flows through the current control element 208b, a 15% bypass current flows through the current control element 28c, and a 15% bypass current flows through the current control element 28d. In this way, instructions are given to produce equal amounts of bypass currents such that the electric powers generated by the heater electrode DC power supplies 109 are kept constant. Consequently, if temperature detection is done at one location, the temperature of any one of the four arcs circumferentially spaced from each other can be adjusted to an arbitrary value.

There are similar temperature control configurations for the inner heater 202 and intermediate heater 203. In each of plural areas spaced from each other radially around the center of the sample stage 107, a desired circumferential temperature distribution can be achieved. Temperature control can be performed over a wider area. In this way, in the present embodiment, with respect to the mounting surface of the dielectric film 211 of the sample stage 107, in plural areas divided along radial directions, heaters are connected in parallel. In areas divided circumferentially, heaters are connected in series.

According to the above-described embodiment, inside the film or plate-like member of the dielectric film constituting the circular mounting surface of the sample stage, each heater arranged circumferentially at the same radial position or within a given radial range is constituted by a series circuit for each area divided circumferentially from other areas. In the above embodiment, power feeding lines equivalent to those used in the conventional technique are used.

Furthermore, the bypass circuits for adjusting the electric powers applied to the respective heaters arranged in the areas are electrically connected in parallel with their respective heaters. Because of this configuration, the different portions of the heaters are connected in series and supplied with electrical current from a common power supply. The amounts of heat generated from the individual areas are adjusted to different values. In consequence, the amount of heat on the mounting surface of the sample stage can be made uneven circumferentially. Temperature variations in the wafer or sample stage in the circumferential direction are reduced by making adjustments based on the temperatures on the wafer or sample stage from which amounts of heat are detected. This improves the accuracy at which a wafer is processed using a plasma.

Adjusting devices forming the bypass circuits and connected in parallel with the arcuate resistors disposed inside the dielectric film 211 in a corresponding manner to the arcs and cables electrically connecting the adjusting devices with the arcuate resistors are disposed either in the sample stage 107 of the present embodiment or in the processing chamber. In particular, the sample stage 107 of the present embodiment has an atmospheric-pressure space in an interior located below its basic material 210. Some of the adjusting devices and cables are installed in this space. On the other hand, the circuitry formed by the outer heater 204 having the arcuate resistors electrically connected in series and the bypass circuit and filter 118 disposed between the circuitry and the heater electrode DC power supplies 109 for supplying DC power to the circuitry are disposed either outside the sample stage 107 or outside the processing chamber, the filter 118 acting to remove or reduce RF power components.

In this configuration, the impedance of the power feeding paths between the heater circuit connected in series with the RF bias power and the heater electrode DC power supplies 109 is much greater than the impedances of the bypass circuits or adjusting devices relative to the RF power. Therefore, if the amounts of current supplied to the heaters are adjusted by operation of the bypass circuits or adjusting devices, variations in the electric powers supplied to the outer heater 204 are suppressed or the manifestation of adverse effects of the RF power is reduced. As a consequence, the bypass cable length is suppressed. As a result, increases of leakage of the bias currents due to increases in the electrostatic capacity of the power feeding lines can be suppressed. Hence, it is possible to prevent the wafer etch rate from becoming nonuniform. Also, electrostatic damage to the devices can be prevented.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method comprising the steps of:
   mounting a wafer to be processed on an upper surface of a sample stage which is disposed in a processing chamber inside a vacuum vessel;
   generating a plasma inside the processing chamber; and
   adjusting a temperature of the wafer in a predetermined permissible range using at least one of heater units which is disposed inside a dielectric film constituting the upper surface of the sample stage and configured to generate heat,
   wherein the at least one of heater units is comprised of a plurality of arcuate portions which are arranged in a ring-shape so as to surround a central region of the dielectric film and connected in series inside the dielectric film, and the at least one of heater units is supplied DC power from a DC power supply, wherein each of the plurality of arcuate portions constituting a circuit arranged in a ring-shape is connected to an adjacent arcuate portion by each of a plurality of connection portions and has a same length forming a same circumferential angle around the central region, and each of the heater units disposed in each of the plurality of the ring-shaped regions constitutes a loop, and the arcuate portions disposed in one of the ring-shaped regions closer to the center region form a greater circumferential angle around the central region than those of the arcuate portions disposed in the ring-shaped region outwardly located, and
   the step of adjusting the temperature of the wafer includes a step of adjusting amounts of DC current in each of the plurality of arcuate portion of the at least one of heater units supplied from the DC power supply.

2. The plasma processing method according to claim 1, wherein
   the step of adjusting the temperature of the wafer includes a step of adjusting an amount of DC current in each of the plurality of arcuate portions of the at least one of heater units by adjusting an amount of DC current supplied to each of a plurality of circuit elements which is arranged to be connected in parallel to corresponding one of the plurality of arcuate portions of the at least one of heater units.

3. The plasma processing method according to claim 1, wherein
   the step of adjusting the temperature of the wafer includes a step of adjusting the amount of DC current in each of the plurality of arcuate portions of the at least one of heater units so that an amount of the DC power supplied to the at least one of heater units can be maintained constant.

4. The plasma processing method according to claim 1, wherein
   two heater units are disposed at different positions adjacent to each other in a radial direction from the center of the dielectric film, and a number of the arcuate portions of one of the two heater units disposed inner side is less than a number of the arcuate portions of the other of the two heater units disposed outer side.

5. The plasma processing method according to claim 1, wherein two of the heater units are disposed at different positions adjacent to each other in a radial direction from the center of the dielectric film, a number of the arcuate portions of one of the two heater units disposed inner side is less than a number of the arcuate portions of the other of the two heater units disposed outer side, and the plurality of arcuate portions of each of the two heater units have an equal circumferential length or angle around a central region of the dielectric film.

6. The plasma processing method according to claim 1, wherein two heater units are disposed at different positions adjacent to each other in a radial direction from the center of the dielectric film, a number of the arcuate portions of one of the two heater units disposed inner side is less than a number of the arcuate portions of the other of the two heater units disposed outer side, and the plurality of arcuate portions of each of the two heater units have an equal circumferential length or angle around a central region of the dielectric film, and the step of adjusting the temperature of the wafer includes a step of adjusting the amount of DC current in each of the plurality of arcuate portions in each of the two heater units so that an amount of the DC power supplied to the one of heater units can be maintained constant.

7. The plasma processing method according to claim 2, wherein two heater units are disposed at different positions adjacent to each other in a radial direction from the center of the dielectric film, a number of the arcuate portions of one of the two heater units disposed inner side is less than a number of the arcuate portions of the other of the two heater units disposed outer side, and the plurality of arcuate portions of each of the two heater units have an equal circumferential length or angle around a central region of the dielectric film, and the step of adjusting the temperature of the wafer includes a step of adjusting the amount of DC current in each of the plurality of arcuate portions in each of the two heater units so that an amount of the DC power supplied to the one of heater units can be maintained constant.

* * * * *